United States Patent
Liu

(10) Patent No.: US 11,537,033 B2
(45) Date of Patent: Dec. 27, 2022

(54) PROJECTION DEVICE HAVING SHOCK-ABSORBING STRUCTURE

(71) Applicant: Acer Incorporated, New Taipei (TW)

(72) Inventor: Chun-Chieh Liu, New Taipei (TW)

(73) Assignee: Acer Incorporated, New Taipei (TW)

( * ) Notice: Subject to any disclaimer, the term of this patent is extended or adjusted under 35 U.S.C. 154(b) by 20 days.

(21) Appl. No.: 17/180,701

(22) Filed: Feb. 19, 2021

(65) Prior Publication Data

US 2021/0263399 A1 Aug. 26, 2021

(30) Foreign Application Priority Data

Feb. 26, 2020 (TW) .................................. 109106223

(51) Int. Cl.
*G03B 21/14* (2006.01)
*G03B 21/16* (2006.01)
*H05K 7/20* (2006.01)

(52) U.S. Cl.
CPC ........... *G03B 21/145* (2013.01); *G03B 21/16* (2013.01); *H05K 7/20136* (2013.01)

(58) Field of Classification Search
CPC .............................. G03B 21/145; G03B 21/16
See application file for complete search history.

(56) References Cited

U.S. PATENT DOCUMENTS

| | | | | |
|---|---|---|---|---|
| D601,608 S | * | 10/2009 | Kim | D16/230 |
| D608,814 S | * | 1/2010 | Nagase | D16/230 |
| D854,072 S | * | 7/2019 | Gan | D16/230 |
| 2006/0238725 A1 | * | 10/2006 | Chou | H04N 9/3141 348/E5.143 |
| 2007/0024819 A1 | * | 2/2007 | Halls | G03B 21/16 353/58 |
| 2007/0024820 A1 | * | 2/2007 | Chung | G03B 21/145 353/70 |
| 2007/0024823 A1 | * | 2/2007 | Chung | G03B 21/16 353/85 |
| 2007/0242236 A1 | * | 10/2007 | Sugiura | G03B 21/145 353/85 |
| 2009/0002646 A1 | * | 1/2009 | Fu | G03B 21/145 353/119 |
| 2013/0077054 A1 | * | 3/2013 | Lim | G03B 21/16 353/57 |

FOREIGN PATENT DOCUMENTS

| | | |
|---|---|---|
| CN | 102193292 | 9/2011 |
| CN | 107942608 | 4/2018 |
| CN | 208569281 | 3/2019 |
| EP | 2544454 | 11/2015 |
| TW | 200725156 | 7/2007 |

* cited by examiner

*Primary Examiner* — Bao-Luan Q Le
(74) *Attorney, Agent, or Firm* — JCIPRNET

(57) ABSTRACT

A projection device includes a casing, a projection lens, and a fan. The casing includes a main body, a first base, and a second base, wherein the main body has a first side, a second side opposite to the first side, a middle section located between the first side and the second side, air inlet holes at least distributed in the middle section, and air outlet holes at least distributed in the middle section. The first base is installed on the first side, and the second base is installed on the second side. A minimum outer dimension of the main body falls in the middle section, and the air inlet holes face away from the air outlet holes. The projection lens is installed on the main body and located at the same side as the air outlet holes. The fan is installed in the main body.

11 Claims, 5 Drawing Sheets

PROJECTION DEVICE HAVING SHOCK-ABSORBING STRUCTURE

CROSS-REFERENCE TO RELATED APPLICATION

This application claims the priority benefit of Taiwan application serial no. 109106223, filed on Feb. 26, 2020. The entirety of the above-mentioned patent application is hereby incorporated by reference herein and made a part of this specification.

BACKGROUND OF THE INVENTION

Field of the Invention

The invention relates to a projection device, and more particularly, to a projection device with excellent heat dissipation effect.

Description of Related Art

The projection angle of the image beam of a common projection device is relatively limited, and projection is mostly made to a specific area on the wall. Therefore, relevant manufacturers have been actively improving the structural design of the projection device, so as to allow users to adjust the projection angle of the image beam via a simpler and intuitive operation mode and to ensure unimpeded access to the heat dissipation path of the projection device while adjusting the projection angle of the image beam.

SUMMARY OF THE INVENTION

The invention provides a projection device with excellent heat dissipation effect.

The invention provides a projection device including a casing, a projection lens, and a fan. The casing includes a main body, a first base, and a second base, wherein the main body has a first side, a second side opposite to the first side, a middle section located between the first side and the second side, air inlet holes at least distributed in the middle section, and air outlet holes at least distributed in the middle section. The first base is installed on the first side, and the second base is installed on the second side. A minimum outer dimension of the main body falls in the middle section, and the air inlet holes face away from the air outlet holes. The projection lens is installed on the main body and located at the same side as the air outlet holes. The fan is installed in the main body.

Based on the above, the outer size (or outer diameter) of the casing of the projection device of the invention is gradually decreased from the outside toward the middle section. Based on the geometric design of the casing, when the projection device is placed horizontally on a working plane, no matter how the user rolls the projection device, a gap is maintained between both the air inlet holes and the air outlet holes and the working plane to avoid the flow path of the airflow being blocked by the working plane. Therefore, the projection device of the invention has an excellent heat dissipation effect.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
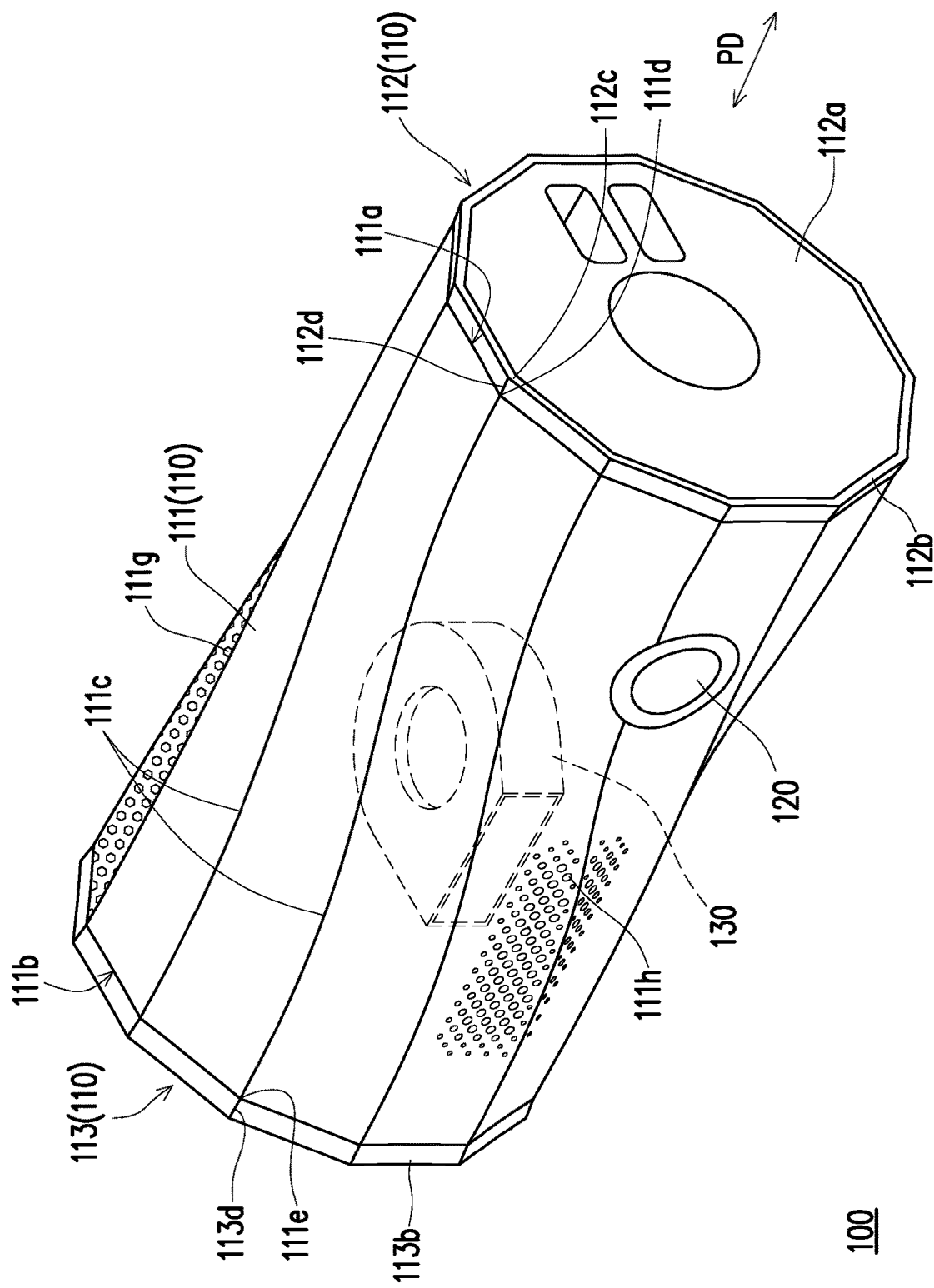
FIG. 1A and FIG. 1B are diagrams of a projection device of an embodiment of the invention at two different viewing angles.
Figure 1B:
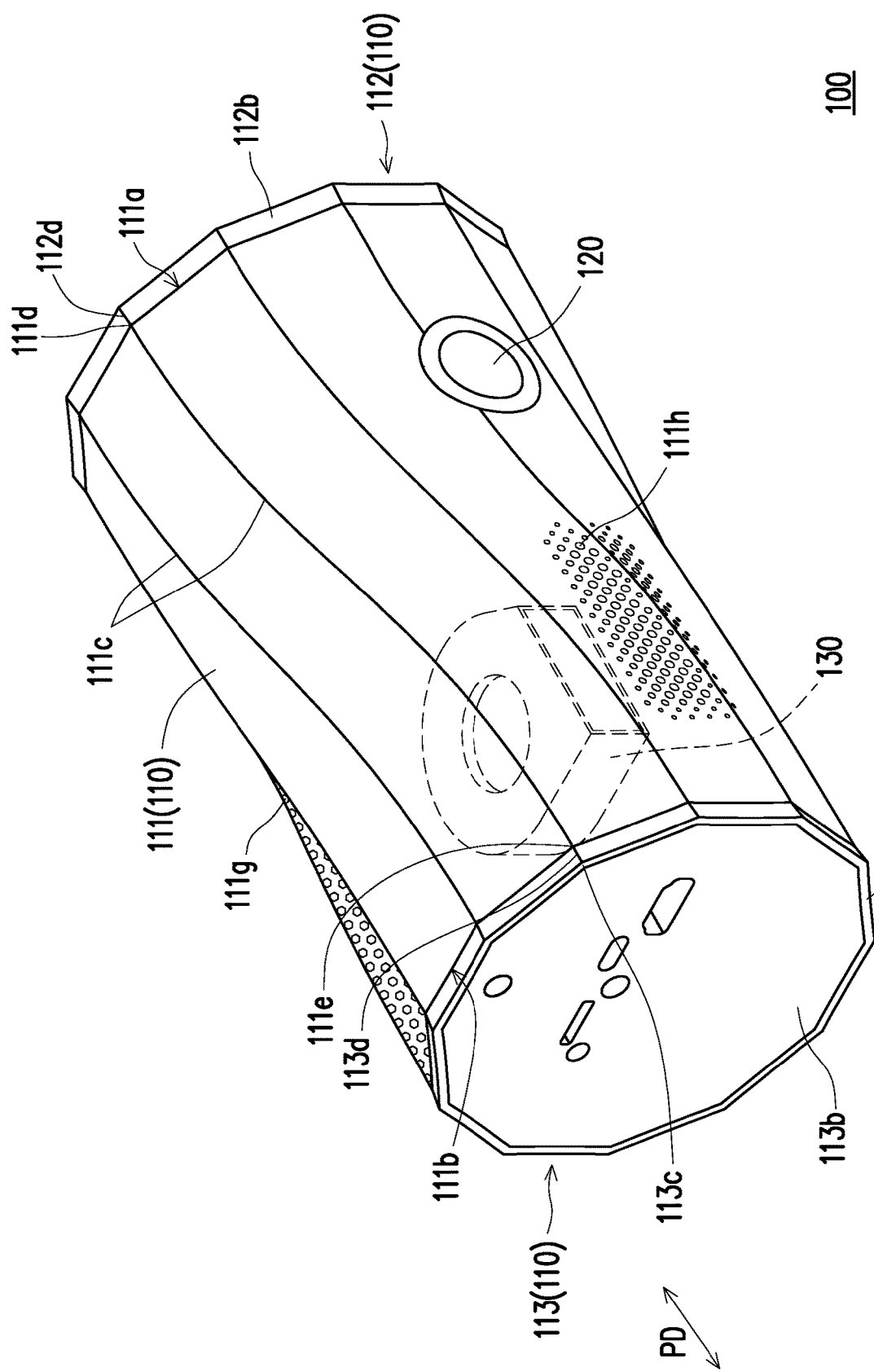
Figure 2A:
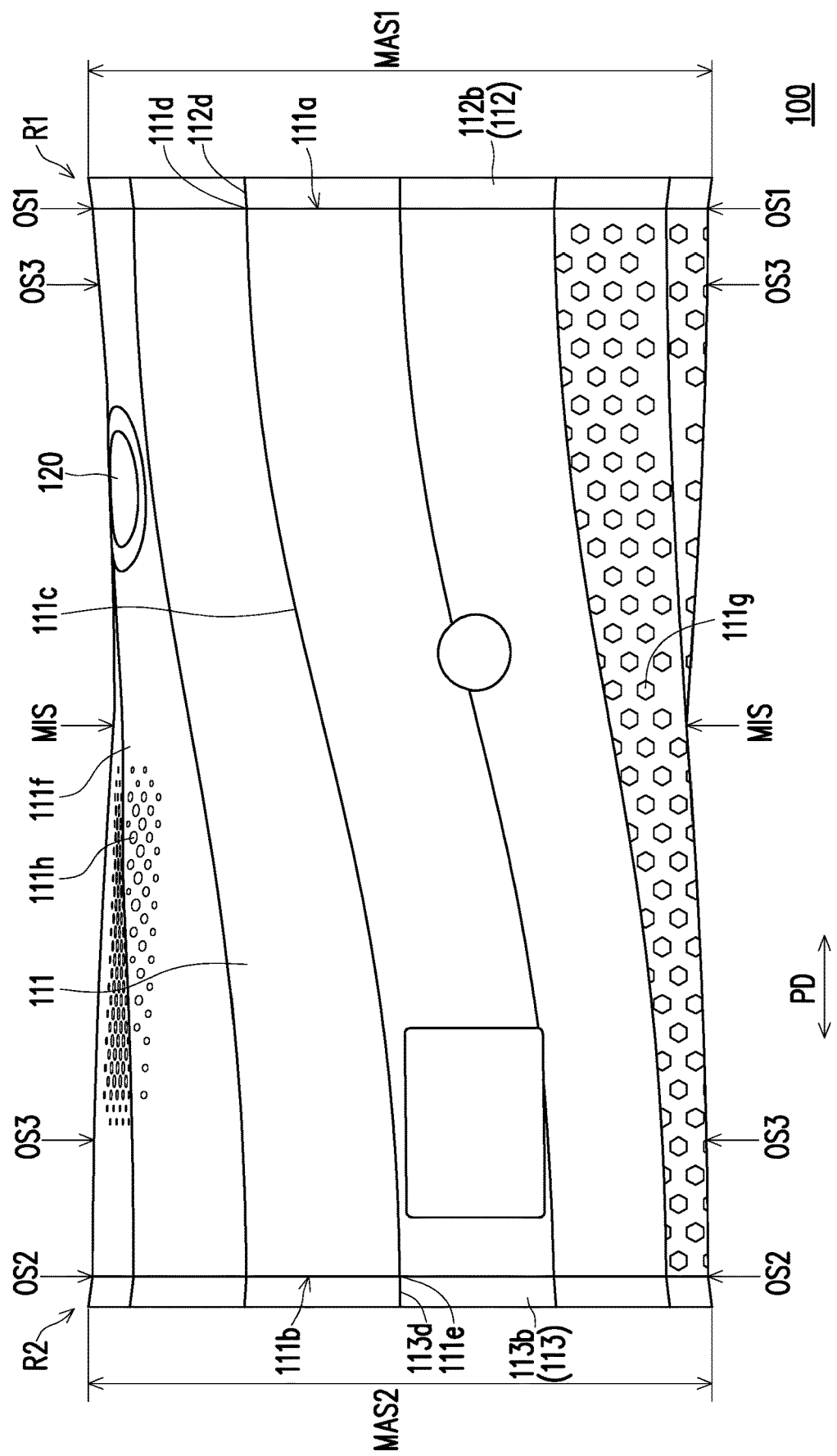
FIG. 2A is a front view of a projection device in a horizontal state of an embodiment of the invention.

FIG. 1A and FIG. 1B are diagrams of a projection device of an embodiment of the invention at two different viewing angles. FIG. 2A is a front view of a projection device in a horizontal state of an embodiment of the invention. Please refer to FIG. 1A, FIG. 1B, and FIG. 2A. In the present embodiment, the overall appearance of a projection device 100 adopts a cylindrical design, which may be placed horizontally on a working plane or stood upright on the working plane. In detail, the projection device 100 includes a casing 110 and a projection lens 120, wherein the projection lens 120 is installed on the casing 110, and a light-emitting surface of the projection lens 120 is exposed outside the casing 110 to project an image beam to the outside.

The casing 110 includes a main body 111, a first base 112, and a second base 113, wherein the projection lens 120 is installed on the main body 111, and the main body 111 has a first side 111a and a second side 111b opposite to the first side 111a. The main body 111 may be a hollow structure for housing a desired element. It may be understood that the projection device 100 further includes a lighting system and a light valve installed in the main body 111, wherein the lighting system is used to provide the lighting beam, and the light valve is disposed on the transmission path of the lighting beam to convert the lighting beam into an image beam. Moreover, the projection lens 120 is disposed on the transmission path of the image beam to project the image beam to the outside.

In the present embodiment, the first base 112 is installed on the first side 111a, and the second base 113 is installed on the second side 111b. In detail, both the first base 112 and the second base 113 are formed by dual-material injection molding, and both have a polygon structure. The first base 112 includes a first cover plate 112a and a first shock-absorbing frame 112b surrounding the first cover plate 112a, and the second base 113 includes a second cover plate 113a and a second shock-absorbing frame 113b surrounding the second cover plate 113a. The material of the first cover plate 112a and the second cover plate 113a may be plastic, and the first shock-absorbing frame 112b and the second shock-absorbing frame 113b may be rubber. Therefore, the first shock-absorbing frame 112b and the second shock-absorbing frame 113b have excellent elasticity and shock-absorbing characteristics.

The first shock-absorbing frame 112b covers the edge of the first cover plate 112a, and the second shock-absorbing frame 113b covers the edge of the second cover plate 113a. For example, when the projection device 100 is placed horizontally on a working plane, the first shock-absorbing frame 112b and the second shock-absorbing frame 113b are in contact with the working plane, and are used to absorb the vibration generated during the operation of the projection device 100 to avoid noise generation. When the projection device 100 rolls on the working plane, the first shock-absorbing frame 112b and the second shock-absorbing frame 113b are in contact with the working plane, so that a gap remains between the outer surface of the main body 111 and the working plane to avoid abrading the outer surface of the main body 111. In addition, if the projection device 100 is accidentally dropped, the first shock-absorbing frame 112b and the second shock-absorbing frame 113b may be used to absorb the impact force, thereby reducing the probability of damage to the projection device 100.

Please continue to refer to FIG. 1A, FIG. 1B, and FIG. 2A. The first cover plate 112a and the second cover plate 113a are both polygon cover plates, wherein the number of sides of the first cover plate 112a is equal to the number of sides of the second cover plate 113a, and the first cover plate 112a and the second cover plate 113a are symmetrically disposed on both sides of the main body 111. Accordingly, the first shock-absorbing frame 112b and the second shock-absorbing frame 113b are both polygon frames, wherein the number of sides of the first shock-absorbing frame 112b is equal to the number of sides of the first cover plate 112a, and the number of sides of the second shock-absorbing frame 113b is equal to the number of sides of the second cover plate 113a. Moreover, the inner contour of the first shock-absorbing frame 112b is the same as the outer contour of the first cover plate 112a, and the inner contour of the second cover plate 113a is the same as the outer contour of the second cover plate 113a.

The first shock-absorbing frame 112b and the second shock-absorbing frame 113b are symmetrically disposed on both sides of the main body 111. When the projection device 100 is placed horizontally on the working plane, one side of the first shock-absorbing frame 112b is in contact with the working plane, and one side of the second shock-absorbing frame 113b is in contact with the working plane to maintain the stability of the projection device 100. Further, the user may roll the projection device 100 so that the other sides of the first shock-absorbing frame 112b and the second shock-absorbing frame 113b are in contact with the working plane to adjust the projection angle of the image beam, such as projecting the image beam onto a wall, ceiling, floor, or table. For the user, the operation of the projection apparatus 100 is relatively simple and intuitive.

For example, the first cover plate 112a and the second cover plate 113a are both dodecagon cover plates, and may be regular dodecagon cover plates, but the invention is not limited thereto. Moreover, both the first shock-absorbing frame 112b and the second shock-absorbing frame 113b are dodecagon frames, and may be regular dodecagon frames, but the invention is not limited thereto.

In the present embodiment, the first shock-absorbing frame 112b has a plurality of first corners 112c, and the second shock-absorbing frame 113b has a plurality of second corners 113c. The number of the first corners 112c is equal to the number of the second corners 113c, and the number of corners of each shock-absorbing frame may be twelve, but the invention is not limited thereto. Since the first shock-absorbing frame 112b and the second shock-absorbing frame 113b are symmetrically disposed on both sides of the main body 111, in a direction PD perpendicular to the first cover plate 112a or the second cover plate 113a, one of the first corners 112c of the first shock-absorbing frame 112b is aligned with one of the second corners 113c of the second shock-absorbing frame 113b. Accordingly, in the direction PD, one side of the first shock-absorbing frame 112b is aligned with one side of the second shock-absorbing frame 113b.

The main body 111 has a plurality of twisted sides 111c, and the number may be twelve, but the invention is not limited thereto. The first corners 112c are connected to the second corners 113c via the twisted sides 111c, wherein each of the twisted sides 111c has a first endpoint 111d connected to a corresponding first corner 112c and a second endpoint 111e connected to a corresponding second corner 113c, and the second endpoint 111e is offset relative to the first endpoint 111d. That is, in each of the twisted sides 111c, the straight-line connection between the first endpoint 111d and the second endpoint 111e is not parallel to the direction PD.

In the case that the number of groups of the first corners 112c and the second corners 113c aligned in the direction PD is twelve, the first endpoint 111d of the first twisted side 111c is connected to the first corner 112c in the first group, and the second endpoint 111e of the first twisted side 111c is connected to the second corner 113c in the twelfth group. The first endpoint 111d of the second twisted side 111c is connected to the first corner 112c in the second group, and the second endpoint 111e of the second twisted side 111c is connected to the second corner 113c in the first group, and so on.

Figure 2B:
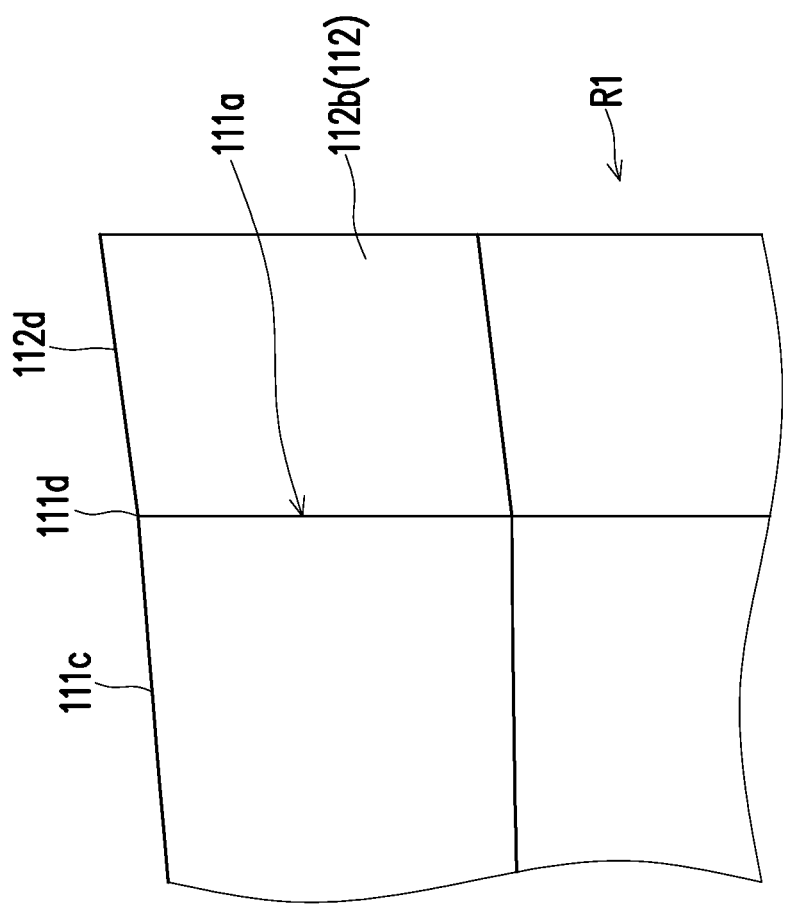
FIG. 2B and FIG. 2C are partially enlarged diagrams of regions R1 and R2 of FIG. 2A.
Figure 2C:
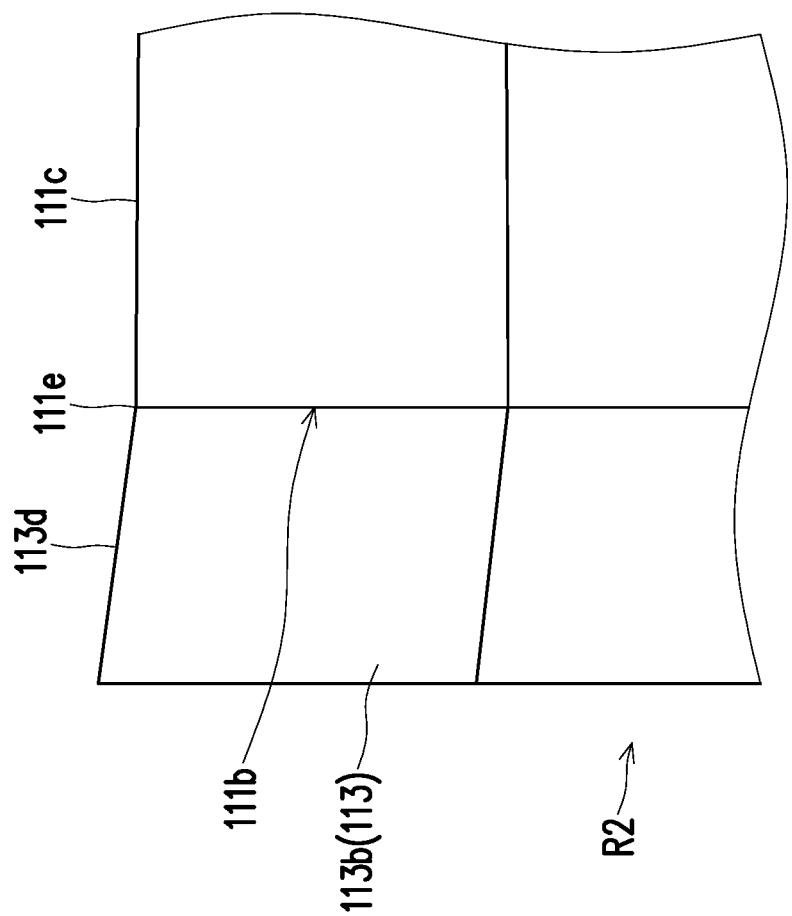

FIG. 2B and FIG. 2C are partially enlarged diagrams of regions R1 and R2 of FIG. 2A. Please refer to FIG. 1A, FIG. 1B, FIG. 2B, and FIG. 2C. In the present embodiment, the first shock-absorbing frame 112b further has a plurality of first hypotenuses 112d located on the first corners 112c, and the second shock-absorbing frame 113b further has a plurality of second hypotenuses 113d located on the second corners 113c. The first endpoints 111d of the twisted sides 111c are connected to the first hypotenuses 112d, and the second endpoints 111e of the twisted sides 111c are connected to the second hypotenuses 113d.

In the direction PD, one of the first hypotenuses 112d of the first shock-absorbing frame 112b is aligned with one of the second hypotenuses 113d of the second shock-absorbing frame 113b. In the case that the number of groups of the first hypotenuses 112d and the second hypotenuses 113d aligned in the direction PD is twelve, the first endpoint 111d of the first twisted side 111c is connected to the first hypotenuse 112d in the first group, and the second endpoint 111e of the first twisted side 111c is connected to the second hypotenuse 113d in the twelfth group. The first endpoint 111d of the second twisted side 111c is connected to the first hypotenuse 112d in the second group, and the second endpoint 111e of the second twisted side 111c is connected to the second hypotenuse 113d in the first group, and so on.

In detail, each of the first hypotenuses 112d is extended from the outside to the corresponding first endpoint 111d, and the slope of each of the twisted sides 111c at the first endpoint 111d is less than or equal to the slope of the corresponding first hypotenuse 112d. Moreover, each of the second hypotenuses 113d is extended from the outside to the corresponding second endpoint 111e, and the slope of each of the twisted sides 111c at the second endpoint 111e is less than or equal to the slope of the corresponding second hypotenuse 113d. That is, the height of each of the first hypotenuses 112d is greater than the corresponding first endpoint 111d, and the height of each of the second hypotenuses 113d is greater than the corresponding second endpoint 111e.

When the projection device 100 is placed horizontally on the working plane, one side of the first shock-absorbing frame 112b is in contact with the working plane, and two of the first corners 112c connected to the side are also in contact with the working plane. Accordingly, one side of the second shock-absorbing frame 113b is in contact with the working plane, and two of the second corners 113c connected to the side are also in contact with the working plane. Accordingly, two of the first corners 112c in contact with the working plane and two of the second corners 113c in contact with the working plane support the main body 111, so that a gap is maintained between the outer surface of the main body 111 and the working plane to avoid abrading the outer surface of the main body 111.

Please refer to FIG. 1A, FIG. 1B, and FIG. 2A. In the present embodiment, the first endpoints 111d of the twisted sides 111c are located on the first side 111a, and the second endpoints 111e of the twisted sides 111c are located on the second side 111b. In detail, the main body 111 further has a middle section 111f, air inlet holes 111g, and air outlet holes 111h, and the middle section 111f is located between the first side 111a and the second side 111b. The air inlet holes 111g are located on one side of the main body 111 and are at least distributed in the middle section 111f. The air outlet holes 111h face away from the air inlet holes 111g, wherein the air outlet holes 111h are located on another side of the main body 111 and are at least distributed in the middle section 111f. For example, the projection lens 120 and the air outlet holes 111h are located on the same side of the main body 111, and the air inlet holes 111g and the air outlet holes 111h may be further distributed between the middle section 111f and the first side 111a or further distributed between the middle section 111f and the second side 111b.

Moreover, the projection apparatus 100 further includes a fan 130 installed in the main body 111, and a centrifugal fan may be used. When the fan 130 is running, cold air from the outside enters the main body 111 via the air inlet holes 111g, and hot air inside the main body 111 is discharged via the air outlet holes 111h. In detail, a minimum outer dimension MIS (or minimum outer diameter) of the main body 111 falls in the middle section 111f. Therefore, when the projection device 100 is placed horizontally on the working plane, no matter how the user rolls the projection device 100, a gap is maintained between both the air intake holes 111g and the air outlet holes 111h and the working plane to avoid the flow path of the airflow being blocked by the working plane. In other words, when the user adjusts the projection angle of the image beam of the projection device 100, the heat dissipation path of the projection device 100 is not hindered, and therefore the projection device 100 has an excellent heat dissipation effect.

Further, a maximum outer dimension MAS1 (or maximum outer diameter) of the first base 112 is greater than an outer dimension OS1 (or outer diameter) of the first side 111a, and a maximum outer dimension MAS2 (or maximum outer diameter) of the second base 113 is greater than an outer dimension OS2 (or outer diameter) of the second side 111b. Furthermore, the maximum outer dimension MAS1 of the first base 112 falls on the outermost side, and therefore the outer dimension (or outer diameter) of the first base 112 is gradually decreased toward the first side 111a. That is, the outer dimension of the block closer to the first side 111a in the first base 112 is smaller. Correspondingly, the maximum outer dimension MAS2 of the second base 113 falls on the outermost side, and therefore the outer dimension (or outer diameter) of the second base 113 is gradually decreased toward the second side 111b. That is, the outer dimension of the block closer to the second side 111b in the second base 113 is smaller.

Moreover, an outer dimension OS3 (or outer diameter) of the main body 111 is gradually decreased from the first side 111a toward the middle section 111f and gradually decreased from the second side 111b toward the middle section 111f. Therefore, the minimum outer dimension MIS (or minimum outer diameter) of the main body 111 falls in the middle section 111f.

Based on the geometric design of the casing 110, when the projection device 100 is placed horizontally on the working plane, no matter how the user rolls the projection device 100, a gap is maintained between both the air intake holes 111g and the air outlet holes 111h and the working plane to avoid the flow path of the airflow being blocked by the working plane.

For example, the projection device 100 is equipped with a speaker, and the casing 110 is provided with sound outlet holes. When the projection device 100 is placed horizontally on the working plane, no matter how the user rolls the projection device 100, a gap is maintained between the sound outlet holes and the working plane to avoid the sound propagation path being blocked by the working plane.

It is specifically noted that the maximum outer dimension MAS1 of the first base 112 is equal to the maximum outer dimension MAS2 of the second base 113, and therefore the stability of the projection device 100 placed horizontally on the working plane may be maintained. Moreover, a plurality of twisted surfaces may be defined on the outer surface of the main body 111 by the twisted sides 111c, and the air inlet holes 111g, the air outlet holes 111h, and the sound outlet holes penetrate a portion of the twisted surfaces. When one side of the first shock-absorbing frame 112b is in contact with the working plane and one side of the second shock-absorbing frame 113b is in contact with the working plane, a gap is maintained between the twisted surfaces and the working plane, so as to avoid the air inlet holes 111g, the air outlet holes 111h, and the sound outlet holes being covered by the working plane.

Based on the above, the outer size (or outer diameter) of the casing of the projection device of the invention is gradually decreased from the outside toward the middle section. Based on the geometric design of the casing, when the projection device is placed horizontally on the working plane, no matter how the user rolls the projection device, a gap is maintained between both the air inlet holes and the air outlet holes and the working plane to avoid the flow path of the airflow being blocked by the working plane. Therefore, the projection device of the invention has an excellent heat dissipation effect.

Moreover, the base of the casing of the projection device of the invention is a polygon structure. When the projection device is placed horizontally on the working plane, the user may roll the projection device so that the base of the casing is in contact with the working plane via different sides to adjust the projection angle of the image beam, such as projecting the image beam onto a wall, ceiling, floor, or table. For the user, the operation of the projection device 100 is relatively simple and intuitive. In detail, the periphery of the base is a shock-absorbing frame. When the projection device is placed horizontally on the working plane, the shock-absorbing frame is in contact with the working plane and is used to absorb vibration generated during the operation of the projection device to avoid noise generation. If the projection device is accidentally dropped, the shock-absorbing frame may be used to absorb the impact force, thereby reducing the probability of damage to the projection device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A projection device, comprising:
a casing comprising a main body, a first base, and a second base, wherein the main body has a first side, a second side opposite to the first side, a middle section located between the first side and the second side, air inlet holes at least distributed in the middle section, and air outlet holes at least distributed in the middle section, the first base is installed on the first side, and the second base is installed on the second side, a minimum outer dimension of the main body falls in the middle section, and the air inlet holes are facing away from the air outlet holes, wherein the first base comprises a first cover plate and a first shock-absorbing frame surrounding the first cover plate, and the second base comprises a second cover plate and a second shock-absorbing frame surrounding the second cover plate, and both the first shock-absorbing frame and the second shock-absorbing frame are polygon frames;
a projection lens installed on the main body and located at a same side as the air outlet holes; and
a fan installed in the main body.

2. The projection device of claim 1, wherein the first shock-absorbing frame has a plurality of first corners, and the second shock-absorbing frame has a plurality of second corners, and in a direction perpendicular to the first cover plate or the second cover plate, the first corners are aligned with the second corners.

3. The projection device of claim 1, wherein the first shock-absorbing frame has a plurality of first corners, and the second shock-absorbing frame has a plurality of second corners, the main body has a plurality of twisted sides, and the first corners are connected to the second corners via the twisted sides.

4. The projection device of claim 3, wherein each of the twisted sides has a first endpoint connected to a corresponding first corner and a second endpoint connected to a corresponding second corner, and the second endpoint of each of the twisted sides is offset relative to the first endpoint.

5. The projection device of claim 4, wherein the first shock-absorbing frame further has a plurality of first hypotenuses located on the first corners, and the second shock-absorbing frame further has a plurality of second hypotenuses located on the second corners, the first endpoints of the twisted sides are connected to the first hypotenuses, and the second endpoints of the twisted sides are connected to the second hypotenuses.

6. The projection device of claim 5, wherein a slope of each of the twisted sides at the first endpoint is less than or equal to a slope of a corresponding first hypotenuse, and a slope of each of the twisted sides at the second endpoint is less than or equal to a slope of a corresponding second hypotenuse.

7. The projection device of claim 1, wherein a maximum outer dimension of the first base is greater than an outer dimension of the first side, and a maximum outer dimension of the second base is greater than an outer dimension of the second side.

8. The projection device of claim 7, wherein the maximum outer dimension of the first base is equal to the maximum outer dimension of the second base.

9. The projection device of claim 7, wherein an outer dimension of the first base is gradually decreased toward the first side, and an outer dimension of the second base is gradually decreased toward the second side.

10. The projection device of claim 1, wherein a material of the first shock-absorbing frame and the second shock-absorbing frame comprises rubber.

11. The projection device of claim 1, wherein an outer dimension of the main body is gradually decreased from the first side toward the middle section and gradually decreased from the second side toward the middle section.

* * * * *